United States Patent
Pilgram

(10) Patent No.: US 7,346,639 B2
(45) Date of Patent: Mar. 18, 2008

(54) METHOD AND APPARATUS FOR SUPPRESSING LIMIT CYCLES IN NOISE SHAPING FILTERS

(75) Inventor: Berndt Pilgram, München (DE)

(73) Assignee: Infineon Technologies AG, Munich (DE)

(*) Notice: Subject to any disclaimer, the term of this patent is extended or adjusted under 35 U.S.C. 154(b) by 672 days.

(21) Appl. No.: 10/712,610

(22) Filed: Nov. 13, 2003

(65) Prior Publication Data

US 2004/0096070 A1     May 20, 2004

Related U.S. Application Data

(63) Continuation of application No. PCT/DE02/01431, filed on Apr. 17, 2002.

(30) Foreign Application Priority Data

May 22, 2001 (DE) .................. 101 25 000

(51) Int. Cl.
  *G06F 17/10* (2006.01)
  *G06F 17/15* (2006.01)
(52) U.S. Cl. .................. 708/320; 708/5
(58) Field of Classification Search ......... 708/320, 708/5
See application file for complete search history.

(56) References Cited

U.S. PATENT DOCUMENTS

| 4,156,876 A | * | 5/1979 | Debuisser | 342/189 |
| 4,809,207 A | * | 2/1989 | Nillesen | 708/320 |
| 5,629,881 A | | 5/1997 | Leeb et al. | |
| 5,818,741 A | * | 10/1998 | Boie et al. | 708/320 |
| 6,112,218 A | * | 8/2000 | Gandhi et al. | 708/320 |

FOREIGN PATENT DOCUMENTS

| DE | 44 08 768 C1 | 5/1995 |
| DE | 199 12 447 A1 | 9/2000 |
| EP | 0 673 114 B1 | 9/1995 |
| JP | 01049310 A | 2/1989 |
| JP | 04268821 A | 9/1992 |
| WO | 00/31879 | 6/2000 |

* cited by examiner

*Primary Examiner*—Tan V. Mai
(74) *Attorney, Agent, or Firm*—Laurence A. Greenberg; Werner H. Stemer; Ralph E. Locher

(57) ABSTRACT

Harmonic interference caused by limit cycles occurs in the resultant signals of filters for noise conversion as a consequence of limit cycles. A feedback loop is connected downstream of the actual filter and is used to effectively suppress the limit cycles. A feedback signal $y_{FB}$ that is added to the output signal of the filter block is generated in the feedback loop. The invention can be implemented using both analog and digital technology.

29 Claims, 5 Drawing Sheets

METHOD AND APPARATUS FOR SUPPRESSING LIMIT CYCLES IN NOISE SHAPING FILTERS

CROSS-REFERENCE TO RELATED APPLICATION

This application is a continuation of copending International Application No. PCT/DE02/01431, filed Apr. 17, 2002, which designated the United States and was not published in English.

BACKGROUND OF THE INVENTION

Field of the Invention

The invention relates to an apparatus and a method for suppressing limit cycles in noise conversion, and is suitable, in particular, for use in audio signal processing.

When an audio signal is read out at a sampling rate that is substantially higher than the sampling rate required in accordance with the Nyquist theorem, the term oversampling of the audio signal is used. The signal-to-noise ratio can be significantly increased by using such oversampling and by subsequently low-pass filtering the signal. The quantization noise produced during sampling is present as uniformly distributed white noise in a frequency band whose upper limit frequency can be derived from the sampling frequency. Through oversampling of the audio signal, it is possible for the white noise to extend up to an upper limit frequency that is substantially higher than typical audio frequencies. Consequently, a smaller part of the overall noise intensity will be found in the audio frequency band. Consequently, a low-pass filter that suppresses all frequencies above the typical audio frequency band can eliminate a large part of the uniformly distributed quantization noise. The signal-to-noise ratio of the audio signal is therefore significantly improved by oversampling.

Noise shaping filters that usually include two or three filter stages arranged in series known for the purpose of further improving the signal-to-noise ratio. The oversampled signal is multiplied in each case by various coefficients and is fed back to the preceding filter stages. It is possible thereby for the noise to be "colored": the noise intensity at low frequencies is reduced, while the noise intensity at higher frequencies is increased. The high-frequency noise components are eliminated by the downstream low-pass filter. This noise conversion therefore further improves the signal-to-noise ratio.

Limit cycles that are superimposed on the audio signal occur where noise shaping filters are used, because of the instances of feedback provided therein. The harmonic components caused by the limit cycle become perceptible as disturbing whistling noises.

In order to solve this problem, Issued German Patent DE 44 08 768 C1 and Published European Patent application EP 0 673 114 B1 describe a two-stage noise shaping filter in which the limit cycles are suppressed by using an additional feedback block. This feedback block forms a functional unit together with the two-stage noise shaping filter. The method described in these patents as well as the associated circuit arrangement can therefore be used only for the two-stage noise shaping filter described. A further disadvantage is that the upstream circuit arrangement for eliminating the limit cycles is designed only for digital filters.

SUMMARY OF THE INVENTION

It is accordingly an object of the invention to provide an apparatus for suppressing limit cycles and a method for suppressing limit cycles, which overcome the above-mentioned disadvantages of the prior art apparatus and methods of this general type.

In particular, it is an object of the invention to provide such an apparatus and method that can be used with arbitrary noise shaping filters and that are also suitable for analog signal processing.

With the foregoing and other objects in view there is provided, in accordance with the invention, an apparatus for suppressing limit cycles that has a filter block for noise conversion that carries out the noise shaping. Moreover, the apparatus has an adder at whose first input the result signal of the filter block for noise conversion is present, and at whose second input a feedback signal is present. The output signal of the adder is fed to a divider stage that converts this output signal into a digital signal including n bits and into an error signal. Moreover, for the purpose of suppressing limit cycles the apparatus has a feedback block that generates the feedback signal, starting from the error signal, and feeds it to the adder.

By contrast with previous solutions, the filter block for noise conversion (that is to say the actual noise shaping filter) and the feedback block are designed as separate functional units. The task of the feedback block is to generate the feedback signal that serves the purpose of eliminating the limit cycles. Adding this feedback signal to the result or resultant signal of the noise shaping filter permits the interference signals caused by the limit cycles to be effectively eliminated; the whistling noises on the audio signal disappear.

In the inventive solution, the feedback block is connected downstream of the filter block. Consequently, the feedback block can be implemented together with arbitrary digital or analog filter blocks and thus permits a greater freedom in designing noise shaping filters than has been possible with previous solutions.

Conversely, each known noise shaping filter can be provided subsequently with a unit for suppressing limit cycles without the need to change the fundamental filter design. All that is required for this purpose is to adapt the adder, the feedback block and, if appropriate, the divider stage in accordance with the inventive solution. The separate feedback block can be implemented in the form of a simple circuit arrangement and to this extent causes only a slight additional outlay.

It is advantageous when the filter block for noise conversion is designed as a two- or three-stage noise shaping filter. A two- or three-stage noise shaping filter permits effective redistribution of the noise intensity at higher frequencies in conjunction with a moderate outlay on implementation. For this reason, most noise shaping filters have two or three filter stages.

In accordance with an advantageous embodiment of the invention, the feedback block includes a sign converter for determining the positive value of the error signal and includes a time delay element. In order to eliminate the limit cycle, it is essential to determine the positive value of the error signal in a first step. This positive value of the error signal is stored in the time delay element and is the basis of the further calculation of the feedback signal.

It is advantageous when the feedback block includes a sign converter for determining the positive value of the error signal and a filter element having the transfer function $$\frac{1}{z+\alpha},$$

where $\alpha=2^{-s}$, and s is a natural number. In this embodiment of the invention, the simple time delay element is replaced by a filter element with the transfer function $$\frac{1}{z+\alpha}.$$

Such a filter element acts as a modified time delay element in which the output is fed back in an attenuated fashion to the input. Limit cycles can be suppressed more effectively by using such a filter element than when using a simple time delay element.

In accordance with a first, digital embodiment of the invention, the filter block for noise conversion is a digital filter, and the adder, the divider stage and the feedback block are implemented as digital signal processing stages. In this embodiment of the invention, the oversampled digital value sequence is processed in a completely digital fashion.

It is only at the end of the digital signal processing chain that the digital signal is converted into an analog signal and, apart from the digital/analog converter provided for this purpose, there is no need for further analog components. The individual signal processing stages can be implemented in this way simply and cost-effectively using digital technology.

Completely digital signal processing is advantageous particularly with regard to the implementation of the divider stage, which converts the output signal of the adder into a digital signal including n bits and an error signal. In order to generate the digital signal including n bits, it is necessary only to tap the n most significant bits of the output signal including (m+n) bits. It is of particular advantage in this case when the divider stage makes the error signal available as a digital error signal including m bits. The remaining less significant m bits of the output signal of the adder are used for this purpose. Thus, the divider stage carries out only a distribution of the bit lines.

It is advantageous when the sign converter determines the magnitude of the error signal. This can be performed, for example, by adding additional more significant bits, which is equated to zero. As an alternative to this, it is advantageous when the sign converter of the feedback block determines the two's complement of the error signal.

It is advantageous when the filter element with the transfer function $$\frac{1}{z+\alpha}$$

is implemented by a time delay element. The output signal, shifted to the right by s bit positions, of the time delay element, is subtracted in each case from the input signal of the time delay element. Right shifting by s bit positions can be implemented in digital signal processing very simply by using right shifters.

In accordance with a further advantageous embodiment of the invention, when the feedback signal is being determined in the feedback block, the calculation is performed with an accuracy that is increased by at least one additional less significant bit. The computational accuracy within the feedback loop can be raised by representing the relatively low feedback value within the feedback block with an increased precision. As a result, limit cycles can be even more effectively suppressed, specifically even when the feedback value is then represented again with normal accuracy (that is to say without the additional less significant bit).

The apparatus for suppressing limit cycles during noise conversion can advantageously be implemented using a digital signal processor. It is possible, in particular, in this case to program the signal processing steps for implementing the noise shaping filter, and also the feedback loop completely within the digital signal processor. In addition, yet further signal processing routines can be stored on the digital signal processor. Implementation using digital signal processors constitutes the most common embodiment of the invention and can be implemented cost-effectively by using customary signal processors. A further advantage in using digital signal processors is that the various stored routines can be flexibly reprogrammed.

As an alternative to this, it is advantageous when the apparatus for suppressing limit cycles during noise conversion is implemented as a hardware circuit arrangement. This embodiment requires a special chip or a special functional block on a chip for noise conversion and the feedback loop. This provides the possibility of optimized signal flow and, in the event of special requirements, permits better performance than the corresponding solution with digital signal processors.

It is advantageous when the apparatus is used for converting digitized audio signals, in particular in mobile radio receivers. Received oversampled audio signals can be converted by using the noise shaping filter such that they have a good signal-to-noise ratio. The inventive apparatus for suppressing undesired limit cycles can be used to render these audio signals audible without disturbing whistling noises.

A completely digital embodiment of the invention has been described so far. The concept of a noise shaping filter with a downstream feedback loop for suppressing limit cycles can, however, be transferred easily to analog noise shaping filters.

Consequently, it is advantageous when the filter block for noise conversion is an analog filter, and when the adder and the feedback block are implemented as analog signal processing stages. The inventive breakdown of the filter structure into a filter block and a downstream adder as well as a feedback block can thus be generalized to arbitrary analog filters. The field of application of the invention is therefore not limited to digital signal processing, but can also be used in analog signal processing.

It is advantageous in this case when the divider stage has a multiplicity of comparators for generating the digital signal including n bits. In this case, the incoming analog signal is compared with various threshold values. A specific bit of the digital signal is set or not set depending on whether the input signal is greater or smaller than the respective reference signal. The digital signal generated by the divider stage constitutes the result signal or resultant signal of the noise conversion, otherwise executed using analog technology. This digital signal can be converted into an analog result signal by means of a digital/analog converter.

It is advantageous in this case when the error signal is obtained as an analog error signal from the analog output signal of the adder and from the digital signal of n bits, which has been converted back into an analog signal, at the output of the divider stage. The analog error signal serves as starting point for the calculation of the feedback value. The analog error signal represents the error that occurs in converting the analog output signal of the adder into the digital signal generated by the divider stage and including n bits. When the digital output signal of the divider stage is converted back into an analog signal, both the output signal of the adder and the quantized signal at the output of the divider stage are present as analog signals. The analog error signal can then be obtained by subtracting two analog values.

In accordance with an advantageous embodiment of the invention, the adder is implemented using an operational amplifier. In this case, the analog signals to be added are fed to the appropriate inputs of the operational amplifier.

In order to obtain the positive value of the analog error signal, it is advantageous to implement the sign converter with a rectifier.

In accordance with an advantageous embodiment of the invention, the analog signal processing stages are implemented using switched capacitor technology. The signal flow is embodied in this case using electric charges that are conducted via switched capacitors. Switched capacitor technology is currently the most common embodiment for integrated analog circuits.

It is advantageous when the apparatus is used for digitally recording analog signals. The analog embodiment of the invention is used, in particular, whenever the goal is for an analog signal present at the start to be subjected to noise conversion. The analog signal is first fed in this case to an analog noise shaping filter. According to the invention, there are connected downstream of this filter, an adder and an analog feedback block that suppresses the undesired limit cycles produced during the noise conversion. It is possible thereby to improve the quality during the digital recording of analog signals.

In the case of the inventive method for suppressing limit cycles during noise conversion, the input signal is filtered in a first step using a filter block for noise conversion. Subsequently, a feedback signal is added to the result or resultant signal of the filter block for noise conversion. In the next step, the output signal of the addition is converted into a digital signal including n bits and into an error signal. The feedback signal can be generated in the next step starting from the error signal.

The method for suppressing limit cycles during noise conversion can be applied to the result or resultant signals of arbitrary filter blocks for noise conversion and is independent of the respective implementation of the filter block. The method for suppressing limit cycles during noise conversion can to this extent be applied to the resultant signals of arbitrary filter blocks for noise conversion and thus simplifies the design of noise shaping filters.

Other features which are considered as characteristic for the invention are set forth in the appended claims.

Although the invention is illustrated and described herein as embodied in a method and apparatus for suppressing limit cycles in noise shaping filters, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
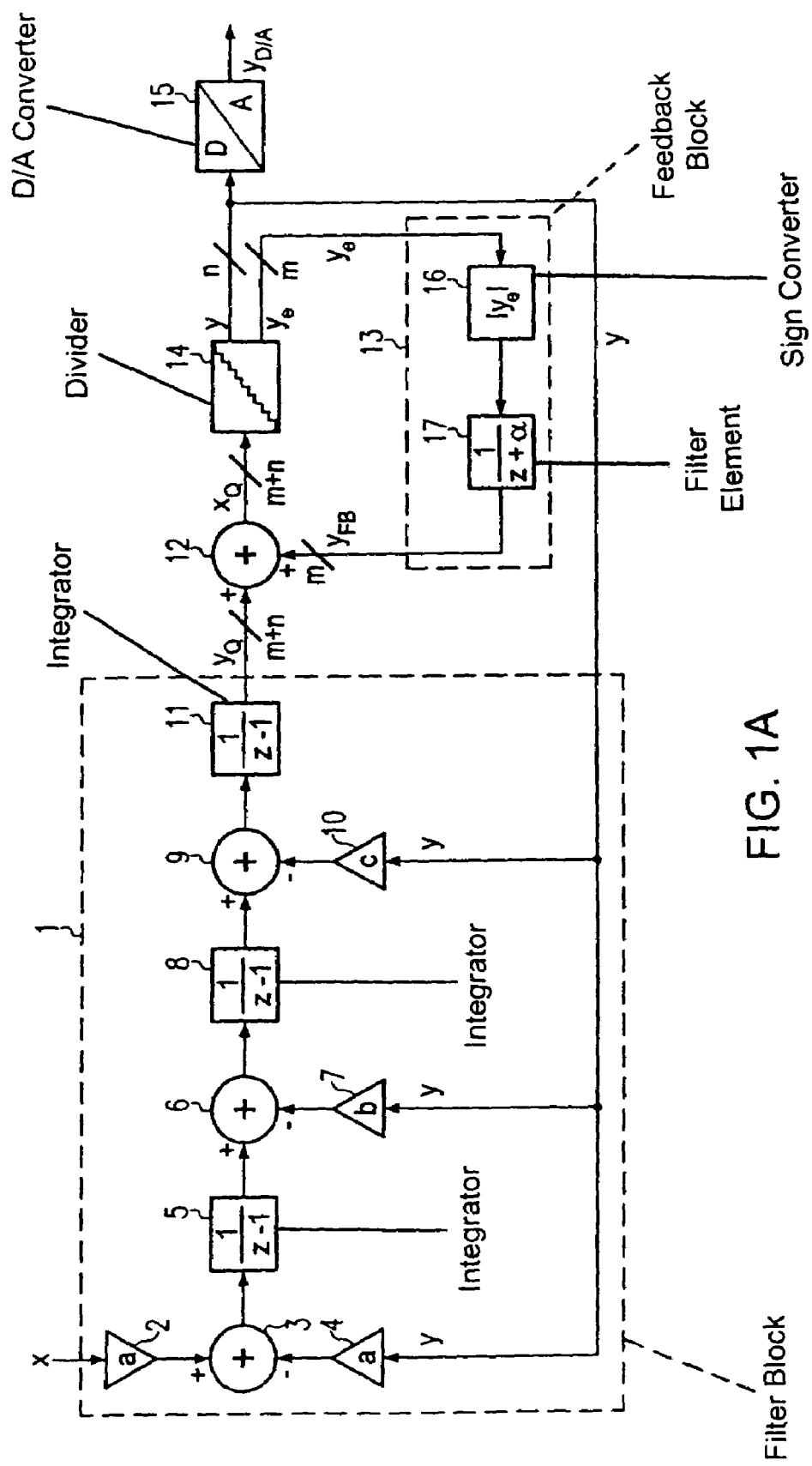
FIG. 1A is a block diagram of a first embodiment of the invention in which the various signal processing stages are implemented completely using digital signal processing technology.
Figure 1B:
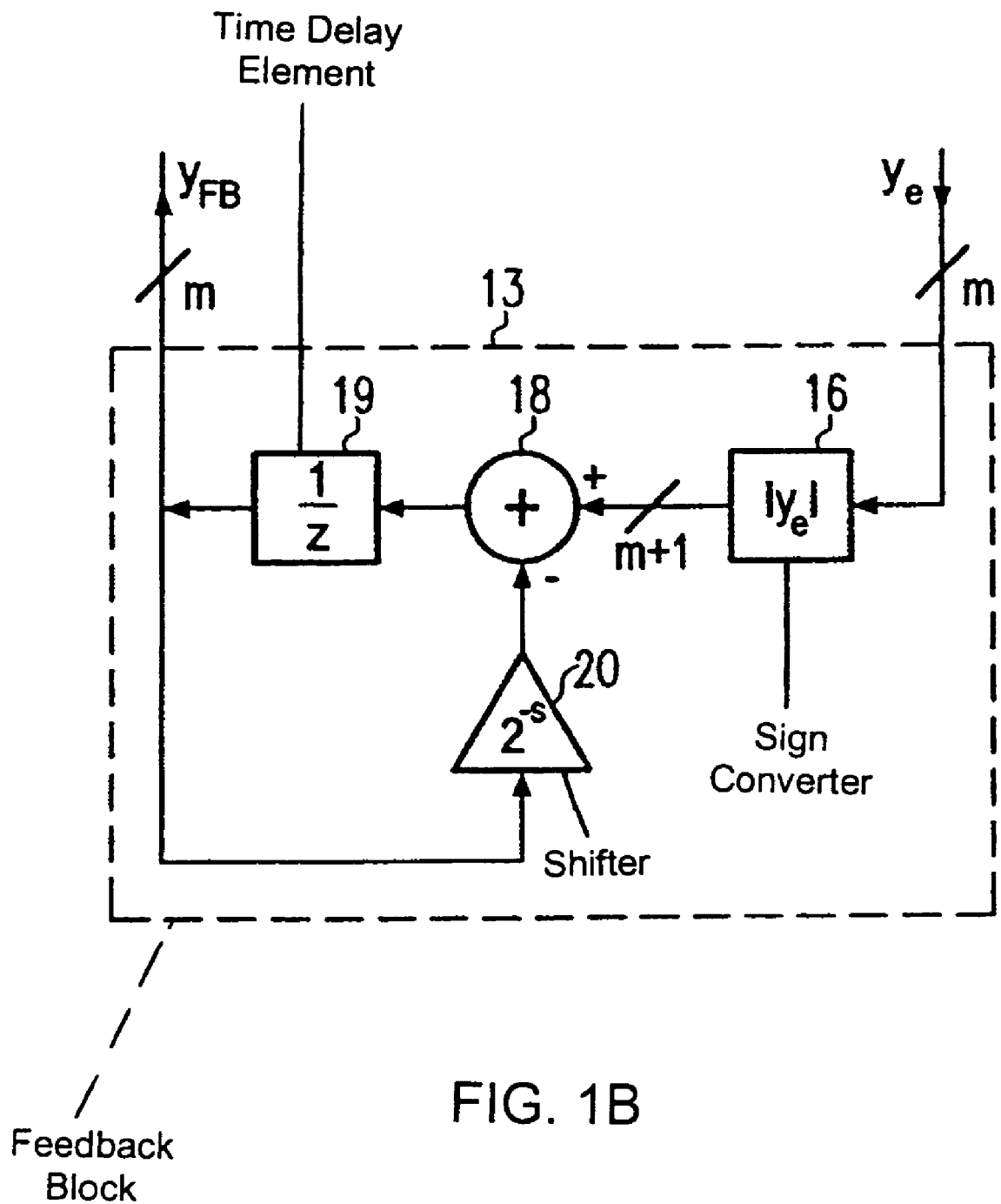
FIG. 1B is a more detailed block diagram of the feedback block implemented using digital signal processing technology.

Referring now to the figures of the drawing in detail and first, particularly, to FIGS. 1A and 1B thereof, there is shown a first exemplary embodiment of the invention in the case of which the individual signal processing stages are implemented completely using digital technology. The digital input signal x, which is illustrated at the top left in FIG. 1A, is fed to the filter block 1 for noise conversion. The input signal x is an oversampled digital input signal that consists of a sequence of, for example, data words 23 bits long. The input signal can be an oversampled audio signal, in which case the sampling rate can be, for example, 4 MHz. Superimposed on the actual useful signal is a quantization noise that has a uniform spectral distribution (white noise).

The filter block 1 is a third-order noise shaping filter that has three series-connected filter stages. In addition to the input signal x, the filter block 1 is also fed with the digital signal y that appears at the output of the circuit arrangement and includes the n most significant bits of the output signal.

The multiplier 2 multiplies the input signal x by the filter coefficient a and feeds it to the adder 3. The signal y, which is fed back, is multiplied by the filter coefficient a in the multiplier 4, and the result or resulting signal (a·y) is fed to the adder 3 with a negative sign. The output of the adder 3 is connected to the integrator 5, which can be described by the transfer function:

$$\frac{1}{z-1}.$$

The adder 3, the two multipliers 2 and 4 and the integrator 5 together form the first filter stage of the three-stage noise shaping filter.

The second filter stage includes the adder 6, the multiplier 7 and the integrator 8. The output signal of the integrator 5 is fed with a positive sign to the adder 6. In addition, the adder 6 is fed with the signal y, which has been multiplied by the filter coefficient b, with a negative sign. The output of the adder 6 is connected to the integrator 8.

The third filter stage includes the adder 9, the multiplier 10 and the integrator 11. The signal y multiplied by the filter coefficient c is subtracted in the adder 9 from the output signal of the integrator 8, and the result of the subtraction is fed to the integrator 11.

The resultant or result signal $y_Q$ of the filter block can be tapped at the output of the integrator 11. The signal $y_Q$ is present as a data word of bit length m+n, in which case m=7 and n=5 can be selected, for example. The feedback signal $y_{FB}$ of length m bits, which is generated by the feedback block 13, is added to the result signal $y_Q$ in the adder 12. Appearing at the output of the adder 12 is the signal $x_Q$, in which case $x_Q = y_Q + y_{FB}$ holds. The output signal $x_Q$ including m+n bits is fed to the divider 14, which splits up the signal $x_Q$ into the digital signal y and the error signal $y_e$. The digital signal y includes the more significant n bits of the signal $x_Q$, and the error signal $y_e$ includes the less significant m bits of the signal $x_Q$.

The digital signal y is on the one hand fed back to the filter block 1, and on the other hand fed to the digital/analog converter 15, which converts the digital signal y into the analog signal $y_{D/A}$.

The initially uniformly distributed quantization noise is displaced toward higher frequencies using the filter block 1 for noise conversion. To this extent, the analog result signal $y_{D/A}$ also no longer has a uniformly distributed noise intensity. Instead of this, a disproportionately high level of noise intensity is present at higher frequencies. Consequently, a large part of the noise intensity can be eliminated by low-pass filtering the signal $y_{D/A}$.

The error signal $y_e$, which includes the less significant m bits of the signal $x_Q$, serves as a starting point for calculating the feedback signal $y_{FB}$. For this purpose, the error signal $y_e$ is fed to the feedback block 13, which includes the sign converter 16 and the filter element 17. The sign converter 16 determines the positive value of the error signal $y_e$. This can be done by forming the magnitude $|y_e|$ of the error signal $y_e$. It is possible, for example, for this purpose to supplement the bit pattern, including m bits, of the signal $y_e$ with a most significant sign bit that is equated to zero. As an alternative to this, it is possible to determine the two's complement of the error signal $y_e$. Depending on the number format used, it is possible by way of example for this purpose to supplement the bit pattern, including m bits, of the error signal by an additional, less significant bit.

The positive value of the error signal $y_e$ is fed to the filter element 17, whose transfer function can be represented as:

$$\frac{1}{z+\alpha},$$

where $\alpha = 2^{-s}$, and s is a natural number. The feedback signal $y_{FB}$, which is fed to the adder 12, can be tapped at the output of the filter element 17.

The feedback block 13 is shown once again in FIG. 1B in a detailed illustration. The error signal $y_e$, including m bits, is fed to the sign converter 16. The magnitude or the two's complement of the error signal $y_e$ is formed in the sign converter 16. The positive value of the error signal is present as a signal (m+1) long at the output of the sign converter 16; this signal is connected to an input of the adder 18. The respective output of the adder 18 is stored in the time delay element 19, at whose output the feedback signal $y_{FB}$ can be tapped.

The signal present at the output of the time delay element 19 is, moreover, fed to the right shifter 20, which carries out a right shift of the bit pattern present by s bit positions. This corresponds to a multiplication of the feedback signal $y_{FB}$ by the factor $2^{-s}$. It has been determined empirically that values of s=6 and s=7 return good results. The bit pattern right-shifted by s bit positions is present with a negative sign at the second input of the adder 18. The adder 18 is preferably a saturated adder.

Thus, the precursor value, weighted in each case with the factor $2^{-s}$, of the feedback signal $y_{FB}$ is subtracted from the positive error signal, in order in this way to obtain the current value of the feedback signal $y_{FB}$. It thus holds in each case:

$$y_{FB}(t) = |y_e(t-1)| - 2^{-s} \cdot y_{FB}(t-1),$$

where $y_{FB}(t-1)$ denotes the precursor value, and $y_{FB}(t)$ denotes the current value of the feedback signal. When carrying out this calculation, it is advantageous to calculate using an accuracy extended by at least one less significant bit when inside the feedback block 13, that is to say in the adder 18, in the time delay element 19 and in the right shifter 20. This means that the calculation is performed with at least (m+1) bits in these blocks. This additional less significant bit remains, however, unaccounted for in the case of the feedback signal $y_{FB}$. Moreover, the respectively required most significant bits are provided in the entire feedback range in such a way that no overflow occurs.

The adder 18, the time delay element 19 and the right shifter 20 correspond in their cooperation to a filter element with the transfer function $$\frac{1}{z+\alpha},$$

where $\alpha = 2^{-s}$ and s is a natural number.

Figure 2A:
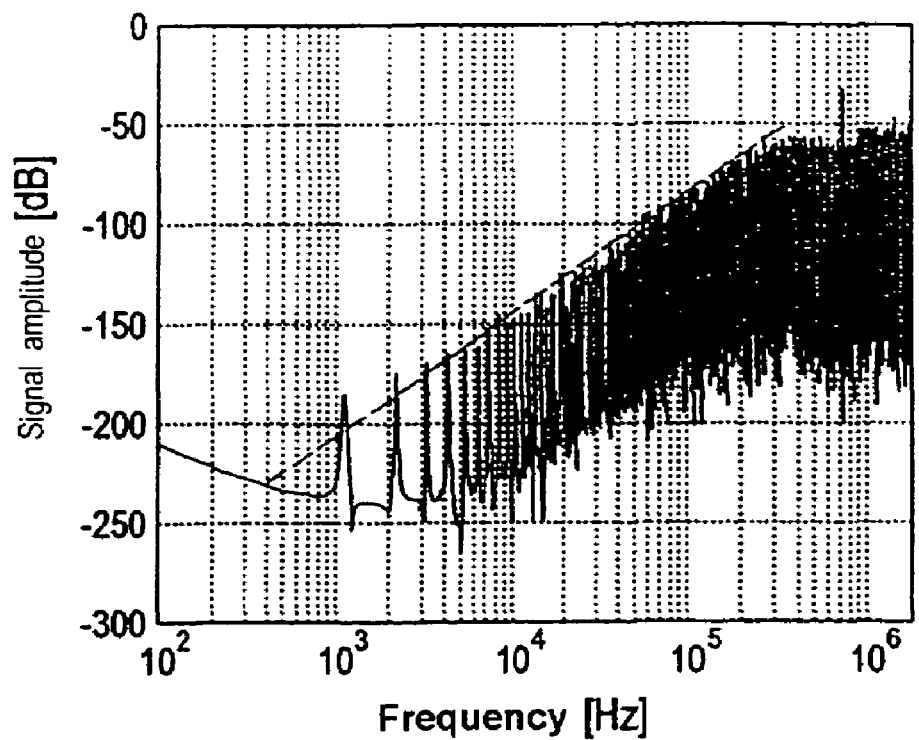
FIG. 2A is a graph of the spectrum of the output signal at the noise shaping filter (continuous line) shown in FIG. 1A when a constant input signal is applied and when the inventive nonlinear feedback block is not used with the digital filter.

The spectrum of the output signal y of the noise shaping filter without the nonlinear feedback block is illustrated in FIG. 2A. The input signal x is held constant in each case. To the right is the frequency in Hertz, while the signal amplitude is plotted in decibels vertically. The corresponding spectrum was recorded in FIG. 2B, but this time using the feedback block 13. Once again, the spectrum of the output signal y at the noise shaping filter is illustrated as a continuous line in the case of a constant input signal x.

However, the trend of the spectrum is depicted as a dashed line.

Figure 2B:
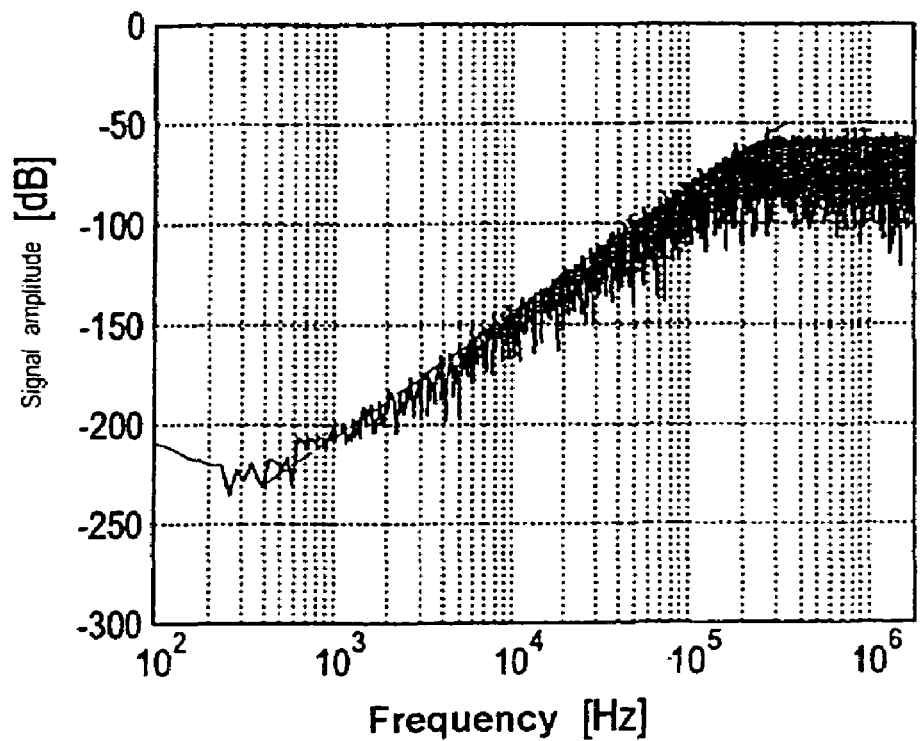
FIG. 2B is a graph of the spectrum of the output signal at the noise shaping filter (continuous line) shown in FIG. 1A when the inventive nonlinear feedback block is used with the digital filter and when a constant input signal is applied.

It can be seen from comparing the spectra shown in FIGS. 2A and 2B that harmonic components superimposed on the actual spectrum in FIG. 2A can be effectively suppressed using the feedback block 13. Clearly, the nonlinear feedback block is thus capable of eliminating the limit cycles produced in the filter block 1.

Figure 3:
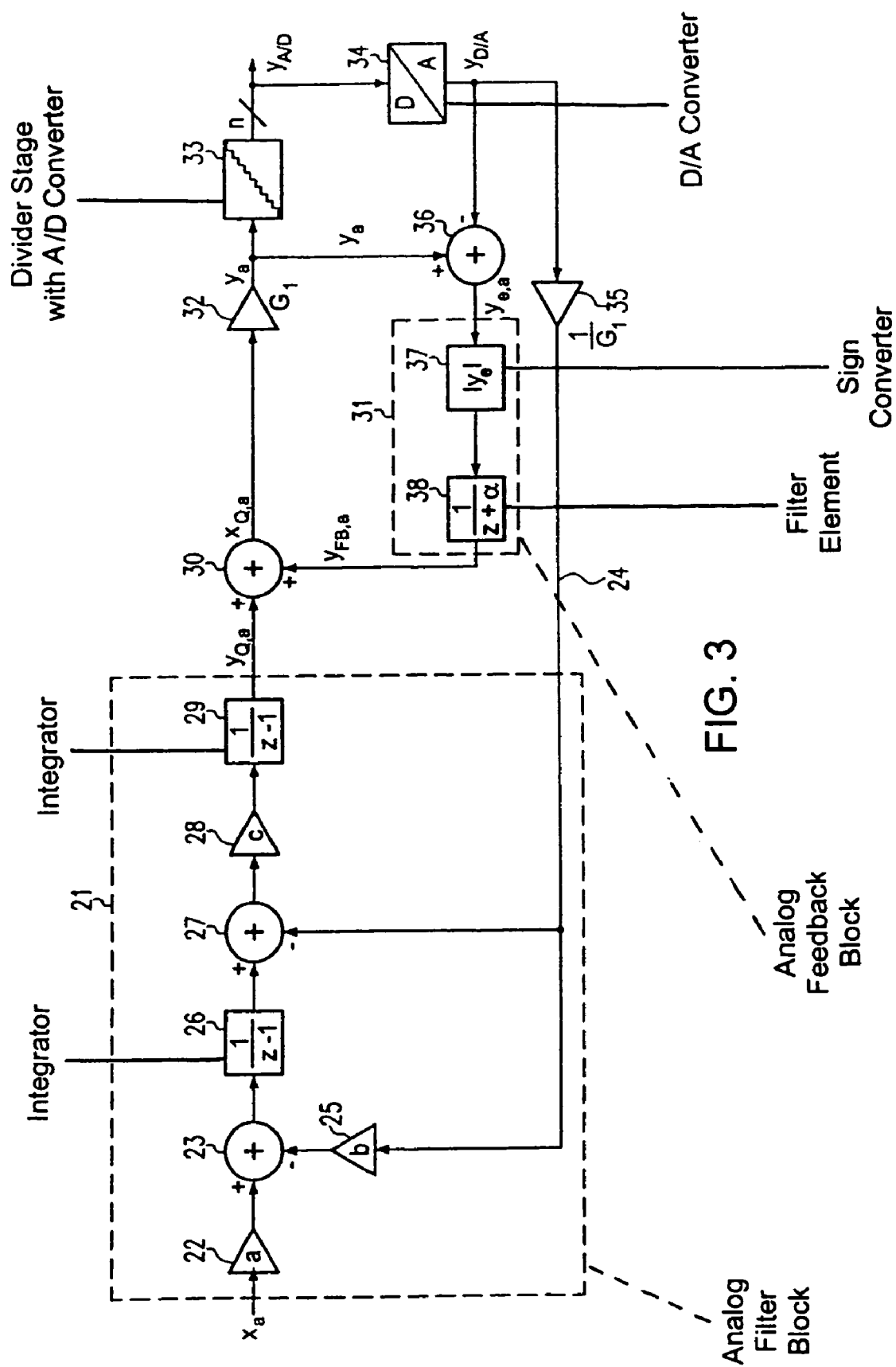
FIG. 3 is a block diagram of a second embodiment of the invention in which the filter block, the adder and the feedback block are constructed using analog circuit technology.

Illustrated in FIG. 3 is an alternative embodiment of the invention that is constructed predominantly using analog circuit engineering. The analog input signal $x_a$ is present at the input of the analog filter block 21, which is constructed as a two-stage noise shaping filter. The analog multiplier 22 multiplies the input signal $x_a$ by the filter coefficient a and the result is present with the positive sign at the first input of the analog adder 23. The fed back result signal 24 is multiplied in the analog multiplier 25 by the filter coefficient b and is present with a negative sign at the second input of the adder 23.

The analog adder 23 can advantageously be designed as an operational amplifier.

The output signal of the adder 23 is added to the integrator 26, whose output is connected to the input of the adder 27. The fed back result signal 24 is present with a negative sign at the second input of the adder 27. The multiplier 28 multiplies the output signal of the adder 27 by the filter coefficient c, and the output signal of the multiplier 28 is integrated in the integrator 29. The analog result signal $y_{Q,a}$ of the filter block 21 can be tapped at the output of the integrator 29.

The analog feedback signal $y_{FB,a}$ is added in the adder 30 to the signal $y_{Q,a}$ in order thus to obtain the analog signal $x_{Q,a}$. This signal $x_{Q,a}$ is multiplied in the amplification element 32 by the gain $G_1$ in order to obtain the analog signal $y_a$. The analog signal $y_a$ is converted in the divider stage 33 into a digital signal $y_{A/D}$ including n bits, it being possible to select n=4, for example. The divider stage 33 is constructed with a multiplicity of comparators that in each compare the analog input signal $y_a$ with various threshold values. The n bit lines, which represent the digital signal $y_{A/D}$, are set to "zero" or "one" depending on the results of these comparison operations.

The analog error signal $y_{e,a}$ that represents the quantization error that occurs during the analog/digital conversion is required as a starting point for calculating the analog feedback signal $y_{FB,a}$. This error signal $y_{e,a}$ is obtained as a difference between the analog signal $y_a$ and the digital signal $y_{A/D}$ including n bits. For this purpose, the digital signal $y_{A/D}$ must, however, first be back-converted into the analog signal $y_{D/A}$. This is performed using the digital/analog converter 34, at whose output the analog signal $y_{D/A}$ is present. This signal is multiplied in the multiplier 35 by the scaling factor $$\frac{1}{G_1},$$

in order to obtain the fed back result signal 24. Moreover, the analog signal $y_{D/A}$ is fed to the analog adder 36 with a negative sign. The adder 36 calculates the analog error signal $y_{e,a}$ as the difference between the analog signals $y_a$ and $y_{D/A}$. It therefore holds that $y_{e,a}=y_a-y_{D/A}$.

The analog error signal $y_{e,a}$ is converted into the analog feedback signal $y_{FB,a}$ by the analog feedback block 31. For this purpose, the absolute value $|y_{e,a}|$ of the error signal $y_{e,a}$ is firstly formed by the sign converter 37. The sign converter 37 can be designed as an analog rectifier. The signal $|y_{e,a}|$ is subsequently filtered by the filter element 38 with the filter function $$\frac{1}{z+\alpha}.$$

The filter function $$\frac{1}{z+\alpha}$$

is represented in the z-plane. It is possible to select the filter parameter $\alpha$, for example, as $\alpha=2^{-6}$. Present at the output of the filter element 38 is the feedback signal $y_{FB,a}$ of the analog feedback block 31, which can then be added to the signal $y_{Q,a}$.

The nonlinear feedback block is inserted as hardware into a prescribed noise shaper structure. It is obvious here to implement the analog signal processing stages using switched capacitor circuit engineering.

The digital signal $y_{A/D}$ including n bits is the result signal of the filter circuit. The aim is to use FIGS. 4A and 4B to show that limit cycles and harmonic components can be effectively suppressed by using the analog feedback block 31.

Figure 4A:
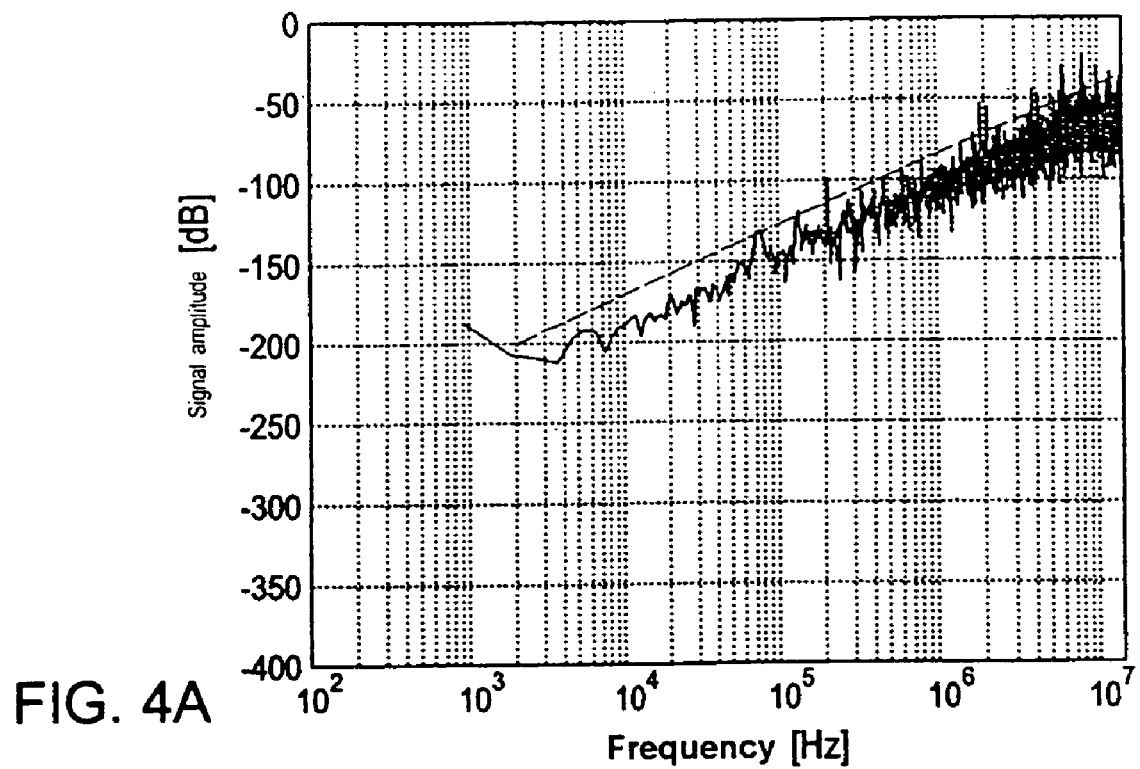
FIG. 4A is a graph of the spectrum of the output signal at the noise shaping filter (continuous line) shown in FIG. 3, but without the inventive nonlinear feedback block for the analog filter.

FIG. 4A illustrates the spectrum of the output signal y of the noise shaping filter without the nonlinear filter block as a continuous line. A constant signal with a superimposed sinusoidal signal of frequency 2 MHz was used as input signal $x_a$. The frequency is plotted to the right in Hertz, while the signal amplitude is plotted in decibels vertically.

Figure 4B:
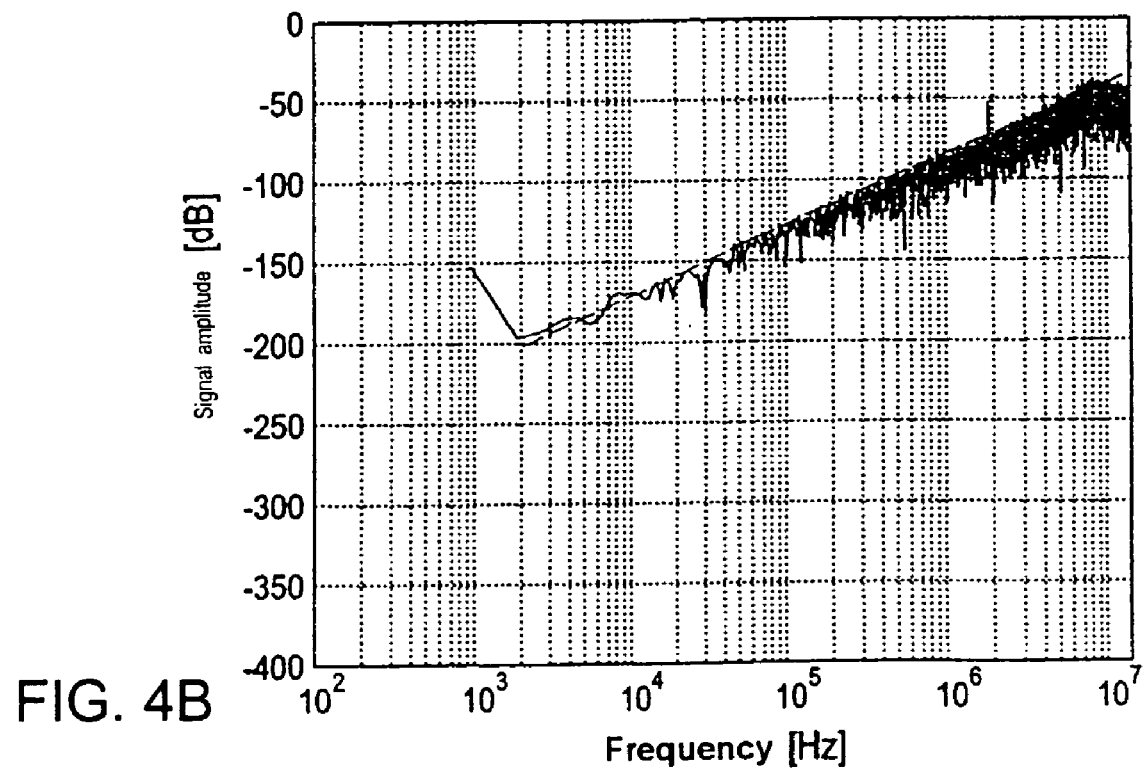
FIG. 4B is a graph of the spectrum of the output signal at the noise shaping filter (continuous line) shown in FIG. 3 with the inventive nonlinear feedback block for the analog filter.

By contrast, in FIG. 4B the spectrum of the result signal $y_a$ is plotted when using the inventive analog feedback block. A constant signal with a superimposed sinusoidal signal of frequency 2 MHz was used once again as the input signal $x_a$. The trend of the spectrum is depicted in FIG. 4B as a dashed line. A clear decrease in the harmonic interference caused by limit cycles can be seen in the case, in particular, of higher frequencies in the range between $10^5$ and $10^7$ Hz.

I claim:

1. An apparatus for suppressing limit cycles during noise conversion, comprising:
    a filter block for noise conversion, said filter block for obtaining an input signal, said filter block for providing a signal;
    an adder having a first input and a second input, said first input of said adder obtaining the signal from said filter block and said second input of said adder obtaining a feedback signal, said adder for providing an output signal;
    a divider stage for converting the output signal from said adder into a digital signal including n bits and into an error signal; and
    a feedback block for generating the feedback signal from the error signal, said feedback block including a sign converter for determining a positive value of the error signal and a time delay element.

2. The apparatus according to claim 1, wherein said filter block is designed as a two-stage noise shaping filter or as a three-stage noise shaping filter.

3. The apparatus according to claim 1, wherein:
said filter block is an analog filter; and
said adder and said feedback block are implemented as analog signal processing stages.

4. The apparatus according to claim 3, wherein:
said divider stage includes an initial stage with an analog/digital converter for generating the digital signal including n bits.

5. The apparatus according to claim 3, wherein said adder is implemented using an operational amplifier.

6. The apparatus according to claim 3, wherein said analog signal processing stages are implemented using switched capacitor technology.

7. The apparatus according to claim 3, wherein the input signal provided to said filter block is obtained from an analog signal that will be digitally recorded.

8. An apparatus for suppressing limit cycles during noise conversion, comprising:
a filter block for noise conversion, said filter block for obtaining an input signal, said filter block for providing a signal;
an adder having a first input and a second input, said first input of said adder obtaining the signal from said filter block and said second input of said adder obtaining a feedback signal, said adder for providing an output signal;
a divider stage for converting the output signal from said adder into a digital signal including n bits and into an error signal;
a feedback block for generating the feedback signal from the error signal;
said feedback block including a sign converter for determining a positive value of the error signal; and
said feedback block further including a filter element having a transfer function $$\frac{1}{z+\alpha},$$

where $\alpha=2^{-s}$, and a is a natural number.

9. An apparatus for suppressing limit cycles during noise conversion, comprising:
a filter block for noise conversion, said filter block for obtaining an input signal, said filter block for providing a signal;
an adder having a first input and a second input, said first input of said adder obtaining the signal from said filter block and said second input of said adder obtaining a feedback signal, said adder for providing an output signal;
a divider stage for converting the output signal from said adder into a digital signal including n bits and into an error signal;
a feedback block for generating the feedback signal from the error signal
said filter block is a digital filter; and
said adder, said divider stage and said feedback block are implemented as digital signal processing stages.

10. The apparatus according to claim 9, wherein said divider stage provides the error signal as a digital error signal including m bits.

11. The apparatus according to claim 9, wherein said feedback block includes a sign converter for determining a magnitude of the error signal.

12. The apparatus according to claim 9, wherein said feedback block includes a sign converter for determining a two's complement of the error signal.

13. The apparatus according to claim 9, wherein:
said feedback block includes a filter element having a transfer $$\frac{1}{z+\alpha},$$

where $\alpha=2^{-s}$, and s is a natural number;
said filter element is implemented by a time delay element providing an output signal, said time delay element obtains an input signal; and
the output signal of said time delay element, shifted to the right by s bit positions, is subtracted from the input signal of said time delay element.

14. The apparatus according to claim 9, wherein when said feedback block generates the feedback signal using a calculation with an accuracy that is increased by at least one additional less significant bit.

15. The apparatus according to claim 9, wherein said filter block, said adder, said divider stage, and said feedback block are implemented with a digital signal processor.

16. The apparatus according to claim 9, wherein said filter block, said adder, said divider stage, and said feedback block are implemented as a hardware circuit configuration.

17. The apparatus according to claim 9, wherein the input signal provided to said filter block is a digitized audio signal being processed in a mobile radio receiver.

18. An apparatus for suppressing limit cycles during noise conversion, comprising:
an analog filter block for noise conversion, said analog filter block for obtaining an input signal, said analog filter block for providing a signal;
an adder, implemented as an analog signal processing stage, having a first input and a second input, said first input of said adder obtaining the signal from said analog filter block and said second input of said adder obtaining a feedback signal, said adder for providing an output signal;
a divider stage for converting the output signal from said adder into a digital signal including n bits and into an error signal;
a feedback block, implemented as an analog signal processing stage, for generating the feedback signal from the error signal;
the digital signal of said divider stage is converted back into an analog signal;
the output signal of said adder is an analog output signal; and
the analog signal of said divider stage and the analog output signal of said adder are used to produce the error signal as an analog error signal.

19. An apparatus for suppressing limit cycles during noise conversion, comprising:
an analog filter block for noise conversion, said analog filter block for obtaining an input signal, said analog filter block for providing a signal;
an adder, implemented as an analog signal processing stage, having a first input and a second input, said first input of said adder obtaining the signal from said analog filter block and said second input of said adder obtaining a feedback signal, said adder for providing an output signal;

a divider stage for converting the output signal from said adder into a digital signal including n bits and into an error signal;

a feedback block, implemented as an analog signal processing stage, for generating the feedback signal from the error signal;

said feedback block includes a sign converter for determining a positive value of the error signal; and said sign converter is implemented using a rectifier.

20. A method for suppressing limit cycles during noise conversion, the method which comprises:

obtaining a resultant signal by using a filter block for noise conversion to filter an input signal;

obtaining an output signal by adding a feedback signal to the resultant signal of the filter block;

converting the output signal into a digital signal including n bits and into an error signal;

generating the feedback signal starting from the error signal by determining a positive value of the error signal, and filtering the positive value of the error signal using a filter element having a filter characteristic $$\frac{1}{z+\alpha},$$

where $\alpha=2^{-s}$, and s is a natural number; and outputting the content of the digital signal to a user.

21. The method according to claim 20, which further comprises:

performing the step of generating the feedback signal by determining a positive value of the error signal and storing the positive value of the error signal in a time delay element.

22. The method according to claim 20, which further comprises:

using digital processing stages to perform the steps of obtaining a resultant signal, obtaining an output signal, converting the output signal, and generating the feedback signal.

23. The method according to claim 22, which further comprises:

converting the output signal, obtained by adding the feedback signal to the resultant signal of the filter block, into a digital signal including n bits and into a digital error signal including m bits.

24. The method according to claim 20, which further comprises:

using analog processing stages to perform the steps of obtaining a resultant signal, obtaining an output signal, converting the output signal, and generating the feedback signal.

25. The method according to claim 24, which further comprises:

converting the output signal, obtained by adding the feedback signal to the resultant signal of the filter block, into a digital signal including n bits.

26. The method according to claim 24, which further comprises:

converting the digital signal back into an analog signal;

providing the output signal, being obtained by the adding, as an analog output signal; and producing the error signal as an analog error signal obtained from the analog output signal and the analog signal converted from the digital signal.

27. The method of claim 20, including the further step off outputting the output signal.

28. A method for suppressing limit cycles during noise conversion, the method which comprises:

obtaining a resultant signal by using a filter block for noise conversion to filter an input signal;

obtaining an output signal by adding a feedback signal to the resultant signal of the filter block;

converting the output signal into a digital signal including n bits and into an error signal;

generating the feedback signal starting from the error signal;

using digital processing stages to perform the steps of obtaining a resultant signal, obtaining an output signal, converting the output signal, and generating the feedback signal;

performing the step of generating the feedback signal by determining a positive value of the error signal, and filtering the positive value of the error signal using a filter element having a filter characteristic $$\frac{1}{z+\alpha},$$

where $\alpha=2^{-s}$, and s is a natural number;

implementing the filter element with a time delay element providing an output signal;

shifting the output signal of the time delay element to the right by s bit positions and each time the output signal is shifted to the right by s bit positions, subtracting the output signal of the time delay element from the input signal of the time delay element; and outputting the content of the digital signal to a user.

29. The method of claim 28, including the further step of outputting the output signal.

* * * * *